US012643408B2

(12) United States Patent
Umeda et al.

(10) Patent No.: US 12,643,408 B2
(45) Date of Patent: Jun. 2, 2026

(54) POWER DISTRIBUTION DEVICE

(71) Applicant: DENSO CORPORATION, Kariya-city (JP)

(72) Inventors: Koichi Umeda, Kariya-city (JP); Tatsuki Nishimata, Kariya-city (JP); Takashi Kawashima, Kariya (JP)

(73) Assignee: DENSO CORPORATION, Kariya (JP)

( * ) Notice: Subject to any disclaimer, the term of this patent is extended or adjusted under 35 U.S.C. 154(b) by 405 days.

(21) Appl. No.: 18/350,254

(22) Filed: Jul. 11, 2023

(65) Prior Publication Data

US 2023/0347746 A1 Nov. 2, 2023

Related U.S. Application Data

(63) Continuation of application No. PCT/JP2021/047483, filed on Dec. 22, 2021.

(30) Foreign Application Priority Data

Jan. 18, 2021 (JP) ................................. 2021-005842

(51) Int. Cl.
| | |
|---|---|
| *B60L 3/04* | (2006.01) |
| *B60L 50/60* | (2019.01) |
| *H01H 50/12* | (2006.01) |
| *H02J 7/70* | (2026.01) |
| *H05K 7/20* | (2006.01) |

(52) U.S. Cl.
CPC ................. *B60L 3/04* (2013.01); *B60L 50/60* (2019.02); *H01H 50/12* (2013.01); *H02J 7/70* (2026.01); *H05K 7/20272* (2013.01); *B60L 2210/10* (2013.01)

(58) Field of Classification Search
CPC ........ B60L 3/04; B60L 50/60; B60L 2210/10; B60L 2270/20; B60L 58/18; B60L 58/20; H01H 50/12; H02J 7/0042; H02J 1/00; H02J 7/00; H05K 7/20272
See application file for complete search history.

(56) References Cited

U.S. PATENT DOCUMENTS

| | | | |
|---|---|---|---|
| 2016/0303948 A1* | 10/2016 | Sakai | .................... B60L 15/007 |
| 2017/0129350 A1* | 5/2017 | Mitsutani | ................ B60L 50/62 |
| 2019/0214805 A1 | 7/2019 | Hiramitsu et al. | |
| 2020/0168419 A1 | 5/2020 | Fujimura et al. | |
| 2022/0189719 A1 | 6/2022 | Isaji et al. | |
| 2022/0231537 A1* | 7/2022 | Hirota | ...................... H02J 7/16 |

FOREIGN PATENT DOCUMENTS

| | | |
|---|---|---|
| DE | 102018214085 A1 | 2/2020 |
| JP | 2008-41376 A | 2/2008 |
| JP | 2008-149897 A | 7/2008 |
| JP | 2020-018043 A | 1/2020 |

* cited by examiner

*Primary Examiner* — Lincoln D Donovan
*Assistant Examiner* — Alex W Lam
(74) *Attorney, Agent, or Firm* — Oliff PLC

(57) ABSTRACT

A power distribution device comprises a system main relay, i.e., SMR, a pre-charge circuit and a control board. The SMR selects between on and off of a current between a power conversion device and a battery. The pre-charge circuit includes a charge resistor and a charge switch which are provided to charge the smoothing capacitor with power supplied from the battery. The control board enables a current smaller than a current flowing through the SMR. The SMR and the control board are arranged in the x-direction via the pre-charge circuit.

12 Claims, 8 Drawing Sheets

POWER DISTRIBUTION DEVICE

CROSS REFERENCE TO RELATED APPLICATIONS

The present application is a continuation application of International Patent Application No. PCT/JP2021/047483 filed on Dec. 22, 2021, which designated the U.S. and is based on and claims the benefit of priority from Japanese Patent Application No. 2021-005842 filed on Jan. 18, 2021, and all the contents of the application are incorporated by reference.

TECHNICAL FIELD

The disclosure provided in this specification relates to a power distribution device.

BACKGROUND

Power distribution devices have at least one electronic control unit (ECU) and some other electric components. In the power distribution device, the other electronic components generate heat and electromagnetic noise which may adversely affect the electronic control unit. In the above aspects, or in other aspects not mentioned, there is a need for further improvements in a power distribution device.

SUMMARY

A power distribution device comprising: a switch unit including a switch which switches between on and off of current between a power receiving object having a smoothing capacitor and a battery; a charge unit including a charge switch and a charge resistor which are provided to charge the smoothing capacitor with power supplied from the battery; and a processing unit through which a current having a smaller amount of current than a current flowing through the switch unit, wherein the switch unit and the processing unit are arranged in an arrangement direction while arranging the charge unit therebetween.

According to this, it is possible to suppress adverse effects by heat and electromagnetic noise generated in an energized switch unit to the processing units.

The reference numerals in parentheses above indicate only a correspondence relationship with a configuration described in an embodiment described later, and do not limit the technical scope in any way.

DETAILED DESCRIPTION

Figure 1:
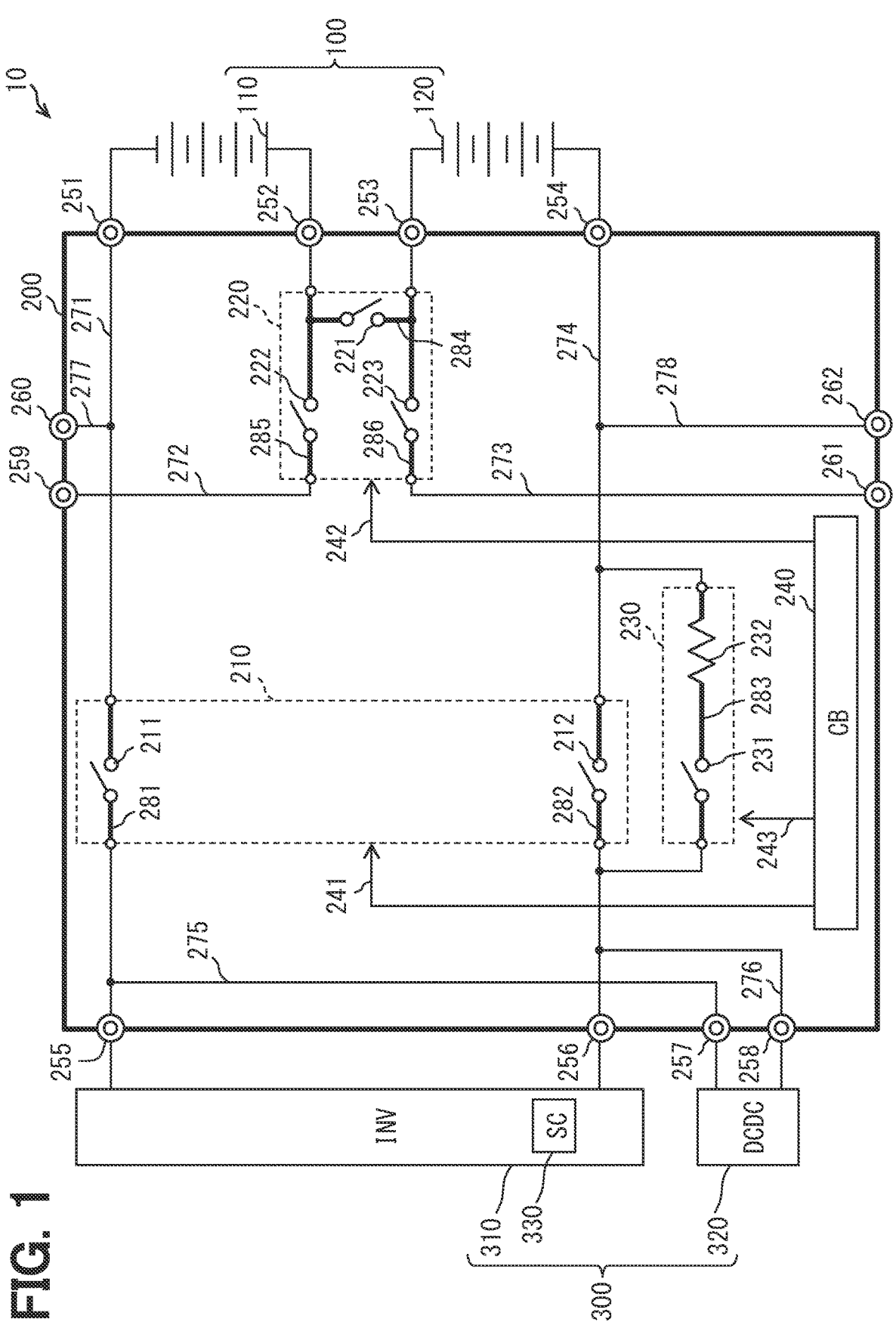
FIG. 1 is a circuit diagram for explaining a power supply system.

The following will describe embodiments for carrying out the present disclosure with reference to the drawings. In each embodiment, parts corresponding to the elements described in the preceding embodiments are denoted by the same reference numerals, and redundant explanation may be omitted. When only a part of a configuration is described in an embodiment, another preceding embodiment may be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

JP2018-206601A discloses a relay unit having a relay, a control terminal, and a base member. A relatively large current such as a driving current of an automobile flows through the relay. An ECU which outputs a control signal to the relay is electrically connected to the control terminal. The base member is made of synthetic resin. The relay is provided on a surface side of the base member. The control terminal is provided on a back side of the base member.

In the configuration described in JP2018-206601A, it is assumed that the ECU is provided on the back side of the base member. In such a configuration, heat and electromagnetic noise generated by the relay through which a relatively large current flows may affect the ECU (processing unit).

Accordingly, it is an object of the present disclosure to provide a power distribution device which is capable of suppressing adverse effect of heat and electromagnetic noise to a processing unit.

First Embodiment

A power distribution device according to a present embodiment is described with reference to FIGS. 1 to 8. The power distribution apparatus is applied to an electric vehicle such as a full electric powered vehicle and a plug-in hybrid vehicle. In this embodiment, a configuration in which the power distribution apparatus is applied to an electric vehicle is described as an example.

<Power Supply System>

FIG. 1 shows a power supply system 10 for an electric vehicle. The power supply system 10 has a battery 100, a power distribution device 200 and a power conversion device 300.

The battery 100 and the power distribution device 200 are electrically connected via a wire harness or the like. The power distribution device 200 and the power conversion device 300 are electrically connected via a wire harness or the like.

Due to this electrical connection configuration, a source power from the battery 100 is supplied to the power distribution device 200. This source power is supplied from the power distribution device 200 to the power conversion device 300.

Further, electric devices (not shown) are connected to the power distribution device 200 via wire harnesses or the like. This electric device is also supplied with power of the battery 100 from the power distribution device 200.

<Battery>

The battery 100 has a first battery 110 and a second battery 120. These batteries contain a plurality of battery cells. This battery cell is, for example, a secondary battery such as a lithium battery. A plurality of battery cells are electrically connected in series in the first battery 110 and the second battery 120.

In this embodiment, the number of battery cells included in each of the first battery 110 and the second battery 120 is the same. Each of the first battery 110 and the second battery 120 outputs a source power of about 400V. The first battery 110 and the second battery 120 correspond to individual batteries. The source power corresponds to an output power.

Approximately 400V of source powers outputted from each of these two batteries are individually outputted from the battery 100. Alternatively, a source power of about 800V consolidated the source powers outputted from each of these two batteries is outputted from the battery 100. A source power output of approximately 400V corresponds to an individual output. A source power output of approximately 800V corresponds to the consolidated output.

Selecting operation of the source power output is performed by the power distribution device 200. A source power of approximately 400V is supplied to the electric devices. A source power of approximately 800V is supplied to the power conversion device 300. The power distribution device 200 is described in detail later.

<Power Conversion Device>

The power conversion device 300 has an inverter 310 and a DCDC converter 320. Although not shown, the inverter 310 is connected to the motor generator of the electric vehicle. The DCDC converter 320 is connected to various kinds of accessories of the electric vehicle. The power conversion device 300 corresponds to the power receiving object.

The inverter 310 converts a supplied DC source power into an AC power. The AC power is supplied to the motor generator. The motor generator works in powering by this AC power. The powering drives running wheels of the electric vehicle to rotate.

The motor generator converts the kinetic energy of the running wheels into electrical energy. The motor generator works regenerating. An AC power generated by this regenerating is converted into DC power by the power conversion device 300. This DC power is supplied to the battery 100 and the DCDC converter 320 via the power distribution device 200.

The DCDC converter 320 is supplied with the source power of the battery 100 and a generated power converted to a DC by the power conversion device 300. The DCDC converter 320 converts a voltage of the supplied DC power to, for example, 12V. This 12V DC power is supplied to various kinds of accessories.

<Power Distribution Apparatus>

Next, the power distribution device 200 is described in detail. As shown in FIG. 1, the power distribution device 200 has an SMR (System Main Relay) 210, a switch matrix 220, a pre-charge circuit 230 and a control board 240.

The SMR 210 has a first SMR 211 and a second SMR 212. The SMR is an abbreviation for System Main Relay. The first SMR 211 and the second SMR 212 are mechanical switch elements. The first SMR 211 and the second SMR 212 are normally closed type switch elements that are turned off in response to an input of the control signal output from the control board 240 and turned on in response to an interruption of the input of the control signal. The SMR 210 corresponds to the switch unit. The first SMR 211 and the second SMR 212 correspond to switches.

The switch matrix 220 has a first selector switch 221, a second selector switch 222 and a third selector switch 223. The first selector switch 221, the second selector switch 223 and the third selector switch 223 are mechanical switch elements. These selector switches are normally open type switch elements that are turned on in response to an input of a control signal output from the control board 240 and turned off in response to an interruption of the input of the control signal. The switch matrix 220 corresponds to the selector unit.

The pre-charge circuit 230 has a charge switch 231 and a charge resistor 232 electrically connected in series. The charge switch 231 is a mechanical switch element. The charge switch 231 is a normally open type switch element that are turned on in response to an input of a control signal output from the control board 240 and turned off in response to an interruption of the input of the control signal. The pre-charge circuit 230 corresponds to the charge unit.

Vehicle information is input to the control board 240 from an in-vehicle ECU or an in-vehicle sensor (not shown). The control board 240 controls the various kinds of switches described above to be in on and off based on this vehicle information. At least one of the various kinds of switches may be a semiconductor switch. The control board 240 corresponds to the processing unit.

The power distribution device 200 has a first connection terminal 251 to a twelfth connection terminal 262 and a first power line 271 to an eighth power line 278 in addition to the components described above.

The first connection terminal 251 to the fourth connection terminal 254 are connected to the battery 100. The fifth connection terminal 255 to the eighth connection terminal 258 are connected to the power conversion device 300. The ninth connection terminal 259 to the twelfth connection terminal 262 are connected to the electric devices.

<800V Source Power>

The first connection terminal 251 is provided at one end of the first power line 271. The second connection terminal 252 is provided at one end of the second power line 272. A negative electrode of the first battery 110 is connected to the first connection terminal 251. A positive electrode of the first battery 110 is connected to the second connection terminal 252.

The third connection terminal 253 is provided at one end of the third power line 273. The fourth connection terminal 254 is provided at one end of the fourth power line 274. A negative electrode of the second battery 120 is connected to the third connection terminal 253. A positive electrode of the second battery 120 is connected to the fourth connection terminal 254.

The second power line 272 and the third power line 273 may be connected via the first selector switch 221 of the switch matrix 220.

Due to the above-described electrical configuration, if the first selector switch 221 is turned on, the first battery 110 and the second battery 120 are electrically connected in series. A potential difference between the first power line 271 and the fourth power line 274 is about 800V.

The fifth connection terminal 255 is provided at one end of the first power line 271. The sixth connection terminal 256 is provided at one end of the fourth power line 274. The inverter 310 is connected to the fifth connection terminal 255 and the sixth connection terminal 256.

The first SMR 211 is provided in the first power line 271. The second SMR 212 is provided in the fourth power line 274.

One end of the fifth power line 275 is connected to a middle point between the fifth connection terminal 255 and the first SMR 211 on the first power line 271. One end of the sixth power line 276 is connected to a middle point between the sixth connection terminal 256 and the second SMR 212 on the fourth power line 274.

The seventh connection terminal 257 is provided at one end of the fifth power line 275. The eighth connection terminal 258 is provided at one end of the sixth power line 276. The DCDC converter 320 is connected to the seventh connection terminal 257 and the eighth connection terminal 258.

Figure 2:
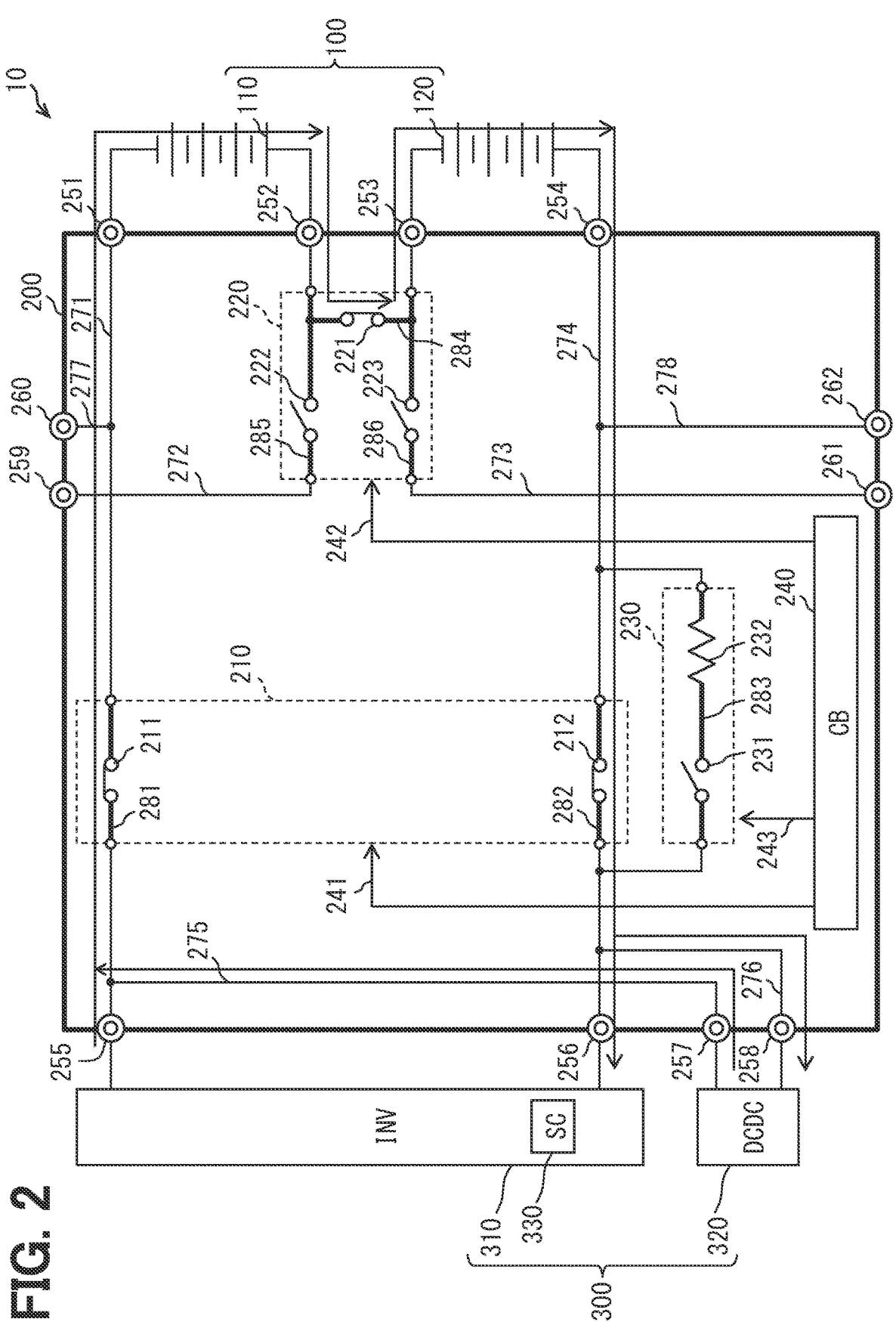
FIG. 2 is a circuit diagram for explaining a current path.
Figure 3:
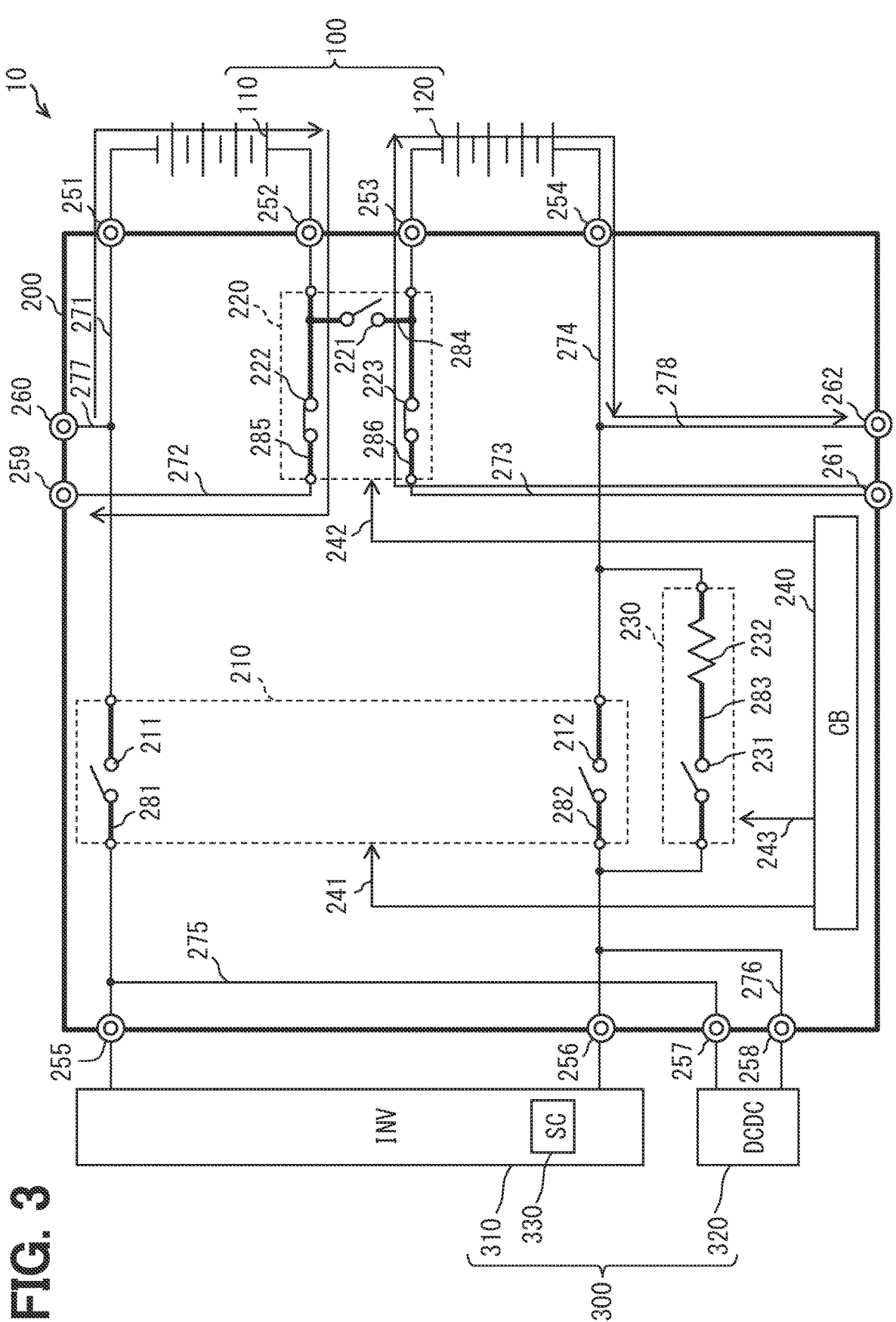
FIG. 3 is a circuit diagram for explaining a current path.

Due to the above-described electrical configuration, if the first selector switch 221 and the first SMR 211 and the second SMR 212 are turned on, a current path through which current flows is formed, for example, as indicated by the solid line arrows in FIG. 2.

As a result, the inverter 310 and the DCDC converter 320 are each supplied with a source power of about 800V. In the case of supplying the source power of about 800V, the second selector switch 222 and the third selector switch 223 are turned off.

<400V Source Power>

As shown in FIG. 1, the ninth connection terminal 259 is provided at the other end of the second power line 272. The second selector switch 222 is provided between the ninth connection terminal 259 and a connection point to the first selector switch 221 in the second power line 272.

One end of the seventh power line 277 is connected to a middle point between the first connection terminal 251 and the first SMR 211 on the first power line 271. The tenth connection terminal 260 is provided at one end of the seventh power line 277.

The eleventh connection terminal 261 is provided at the other end of the third power line 273. The third selector switch 223 is provided between the eleventh connection terminal 261 and a connection point to the first selector switch 221 in the third power line 273.

One end of the eighth power line 278 is connected to a middle point between the second SMR 212 and the fourth connection terminal 254 in the fourth power line 274. The twelfth connection terminal 262 is provided at the other end of the eighth power line 278.

In the electrical configuration shown above, each of the second selector switch 222 and the third selector switch 223 is turned on. At the same time, each of the first selector switch 221, the first SMR 211, and the second SMR 212 is turned off. As a result, a current path through which current flows is formed, as indicated by solid line arrows in FIG. 3, for example.

As a result, a source power of about 400V is supplied to the ninth connection terminal 259 and the tenth connection terminal 260. At the same time, a source power of about 400V is supplied to the eleventh connection terminal 261 and the twelfth connection terminal 262. These source powers of about 400V are supplied to the electrical devices.

<Pre-Charge>

The charge switch 231 and the charge resistor 232 included in the pre-charge circuit 230 are connected in parallel to the second SMR 212 provided on the fourth power line 274. Note that the pre-charge circuit 230 may be connected in parallel to the first SMR 211 provided on the first power line 271.

The power conversion device 300 electrically connected to each of the first power line 271 and the fourth power line 274 includes a large capacity of a smoothing capacitor 330. One of two electrodes of the smoothing capacitor 330 is connected to the first power line 271 and the other is connected to the fourth power line 274. In the drawing, the smoothing capacitor 330 is written as SC.

The smoothing capacitor 330 is used in a charged state. The second SMR 212 connected in parallel in the pre-charge circuit 230 is turned off, and the charge switch 231 and the first SMR 211 are turned on. Also, the first selector switch 221 is turned on, and the second selector switch 222 and the third selector switch 223 are turned off.

If the various kinds of switches are turned into the above state, a source power of about 800V is supplied from the battery 100 to the smoothing capacitor 330 via the charge resistor 232. By supplying electric charge from the battery 100 to the smoothing capacitor 330 via the charge resistor 232 in this manner, a rapid increase in an amount of current flowing from the battery 100 to the smoothing capacitor 330 is suppressed.

<Control Board>

Each of one end of a first signal line 241, a second signal line 242 and a third signal line 243 is connected to the control board 240. The other end of the first signal line 241 is connected to the SMR 210. The other end of the second signal line 242 is connected to the switch matrix 220. The other end of the third signal line 243 is connected to the pre-charge circuit 230. Wirings (not shown) are connected to the control board 240. The control board 240 communicates with the in-vehicle ECU via this wirings.

In the case of charging the smoothing capacitor 330, the control board 240 outputs control signals to the charge switch 231, the first SMR 211, and the first selector switch 221, respectively. As a result, a source power of the battery 100 is supplied to the smoothing capacitor 330 via the charge resistor 232.

In the case of supplying the source power of about 800V, the control board 240 outputs a control signal to the first selector switch 221. As a result, a source power of about 800 V is supplied from the battery 100 to the power conversion device 300. In addition, a regenerated electric power of the motor generator converted to a direct current by the inverter 310 is supplied to the battery 100 and the DCDC converter 320.

In the case of supplying the source power of about 400V, the control board 240 outputs control signals to the first SMR 211, the second SMR 212, the second selector switch 222, and the third selector switch 223, respectively. As a result, a source power of about 400V is supplied from the battery 100 to the electrical devices.

In the case of switching between on and off of each of the first selector switch 221, the second selector switch 221, and the third selector switch 223, the control board 240 temporarily interrupts output of the control signals to the first selector switch 221, the second selector switch 221, and the third selector switch 223. This suppresses formation of unintended current paths via these three selector switches.

<Structure of Power Distribution Device>

Next, a configuration of the power distribution device 200 is described with reference to FIGS. 4-8. Note that drawings schematically show the configuration of the power distribution device 200. The switch matrix 220 is denoted SM. The pre-charge circuit 230 is denoted as PCC. The control board 240 is denoted as CB.

Hereinafter, three directions orthogonal to each other are referred to as an x-direction, a y-direction, and a z-direction. In the drawings, the description of "direction" may be omitted, and the description may be simply "x", "y" and "z". The x-direction corresponds to an arrangement direction.

The power distribution device 200 is installed on a body of the electric vehicle. The power distribution device 200 is located under a floor of a passenger compartment of the electric vehicle. A portion of the body where the power distribution device 200 is mounted and the floor of the passenger compartment are spaced apart in the z-direction. The power distribution device 200 is provided in a short gap in the z-direction between the body and the floor.

Figures 4, 5:
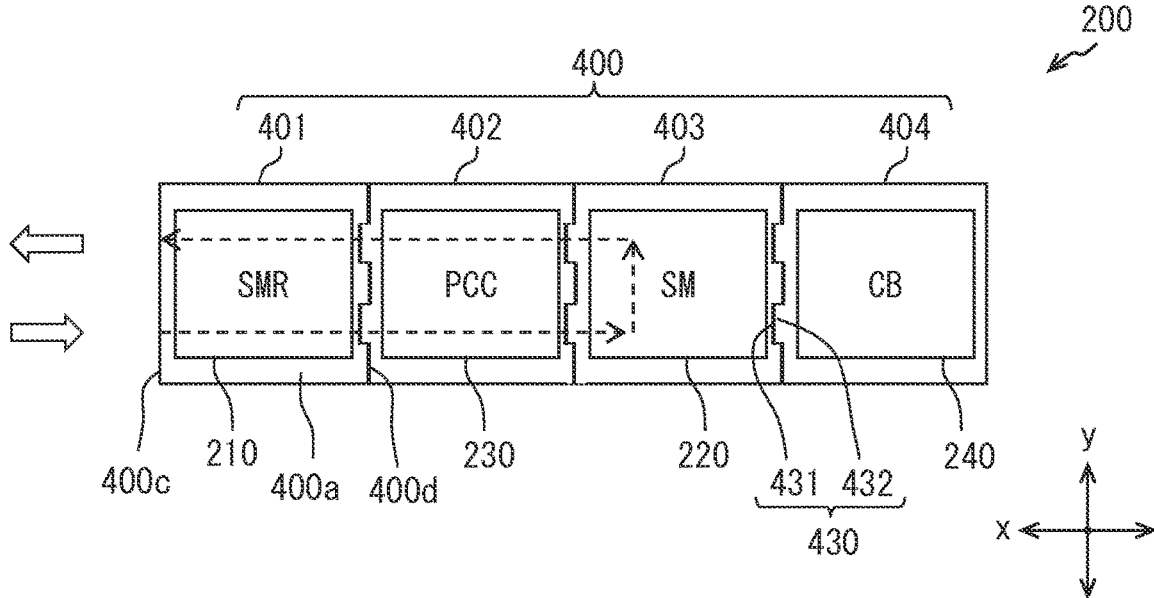
FIG. 4 is a top view of a power distribution device.
FIG. 5 is a partial cross-sectional view of the power distribution device.

The power distribution device 200 has a support portion 400, a heat transfer sheet 410, and a housing 420 shown in FIGS. 4 and 5 in addition to the various kinds of components shown in FIG. 1. The support portion 400 supports the various kinds of components and the heat transfer sheet 410 of the power distribution device 200 shown in FIG. 1. This support portion 400 is provided in the housing 420.

<Support Unit>

The support portion 400 has a first support portion 401, a second support portion 402, a third support portion 403 and a fourth support portion 404. Each of the first support portion 401 to the fourth support portion 404 has a flat shape with a thin thickness in the z-direction. Each of the first support portion 401 to the fourth support portion 404 has a mounting surface 400a and a mounting surface 400b arranged in the z-direction. Various kinds of components of the power distribution device 200 shown in FIG. 1 are mounted on the mounting surface 400a.

The first support portion 401 to the fourth support portion 404 are arranged in the x-direction to form a row in this order. The first support portion 401 and the fourth support portion 404 are positioned at both ends of the row. The second support portion 402 and the third support portion 403 are positioned on a side to the center of the row.

The first support portion 401 to the fourth support portion 404 have a left surface 400c and a right surface 400d arranged in a spaced apart manner in the x-direction. The two support portions arranged side by side in the x-direction are provided with coupling portions 430, which couples both portions, on one of a left surface 400c and on the other one of a right surface 400d. A first coupling portion 431 is provided on the left surface 400c. A second coupling portion 432 is provided on the right surface 400d.

Although the form of the first coupling portion 431 and the second coupling portion 432 is not particularly limited, a snap-fit coupler is adopted in this embodiment. The first coupling portion 431 has a convex portion. The second coupling portion 432 has a concave. The convex portion of the first coupling portion 431 is inserted into the concave portion of the second coupling portion 432. As a result, the first coupling portion 431 and the second coupling portion 432 are fitted together. In the drawing, each of the first coupling portion 431 and the second coupling portion 432 is represented by giving simple unevenness to the left surface 400c and the right surface 400d.

In this embodiment, the second connecting portion 432 is provided on a right surface 400d of the first support portion 401 located at the left end of the row. A first coupling portions 431 is provided on a left surface 400c of the fourth support portion 404 located at the right end of the row. A first connecting portion 431 is provided on a left surfaces 400c of the second support portion 402 and the third support portion 403, respectively, located on the center side of the row. In addition, the second coupling portion 432 is provided on the right surface 400d of each of the second support portion 402 and the third support portion 403.

The second support portion 402 of the first coupling portion 431 is fitted to the second coupling portion 432 of the first support portion 401. The first coupling portion 431 of the third support portion 403 is fitted to the second coupling portion 432 of the second support portion 402. The first coupling portion 431 of the fourth support portion 404 is fitted to the second coupling portion 432 of the third support portion 403.

With the mechanical connection configuration described above, the first support portion 401, the second support portion 402, the third support portion 403, and the fourth support portion 404 are coupled and arranged in an order in the x-direction. A relative positions of these four support portions are determined. The relative positions in the x-direction of the components of the power distribution device 200 mounted on these four support portions are determined.

In this embodiment, the SMR 210 is mounted on the first support portion 401 as shown in FIGS. 4 and 5. The pre-charge circuit 230 is mounted on the second support portion 402. The switch matrix 220 is mounted on the third support portion 403. The control board 240 is mounted on the fourth support portion 404.

Therefore, the SMR 210, the pre-charge circuit 230, the switch matrix 220, and the control board 240 are arranged in the x-direction to form the row in this order. The relative positions of these four components have been determined.

As shown in FIG. 5, the SMR 210 and the pre-charge circuit 230 oppose each other in the x-direction. The pre-charge circuit 230 and the switch matrix 220 oppose each other in the x-direction. The switch matrix 220 and the control board 240 oppose each other in the x-direction.

The pre-charge circuit 230 is larger in size than other components. Therefore, all of the projected areas in the x-direction of the SMR 210, the switch matrix 220 and the control board 240 are projected onto the pre-charge circuit 230.

In this embodiment, the SMR 210 and the switch matrix 220 arranged in the x-direction with the pre-charge circuit 230 interposed therebetween are not opposed in the x-direction. The SMR 210 and the control board 240, which are arranged in the x-direction via the pre-charge circuit 230 and the switch matrix 220, are not opposed to each other in the x-direction. Even if the switch matrix 220 is removed, the pre-charge circuit 230 makes the SMR 210 and the control board 240 to be located in a non-opposing manner in the x-direction.

However, it is also possible to employ a configuration in which a part of the projected area in the x-direction of at least one of the SMR 210, the switch matrix 220 and the control board 240 is projected onto the pre-charge circuit 230. The SMR 210 and the switch matrix 220 may partially oppose in the x-direction. The SMR 210 and the control board 240 may partially oppose the x-direction.

In the drawing, the control board 240 is shown floating above the fourth support portion 404. However, actually, the control board 240 is connected to the fourth support portion 404 via a supporting member (not shown).

<Combination of Support Unit>

The shape of the first coupling portions 431 provided on the supporting portion are the same. The shape of the second coupling portion 432 provided on the supporting portions are the same.

Therefore, the first coupling portion 431 provided on an arbitrary support portion and the second coupling portion 432 provided on a different support portion can be combined and coupled. Therefore, it is possible to change the arrangement of the plurality of support portions in the x-direction. In addition, it is possible to remove an arbitrary support portion and couple the remaining support portions to each other. It is possible to add a new support portion with a coupling portion 430 of the same shape.

For example, if an output selection between the source power of about 400V and the source power of about 800V is unnecessary, the switch matrix 220 and the third support portion 403 on which the switch matrix 220 is mounted are not needed.

Figures 6, 7:
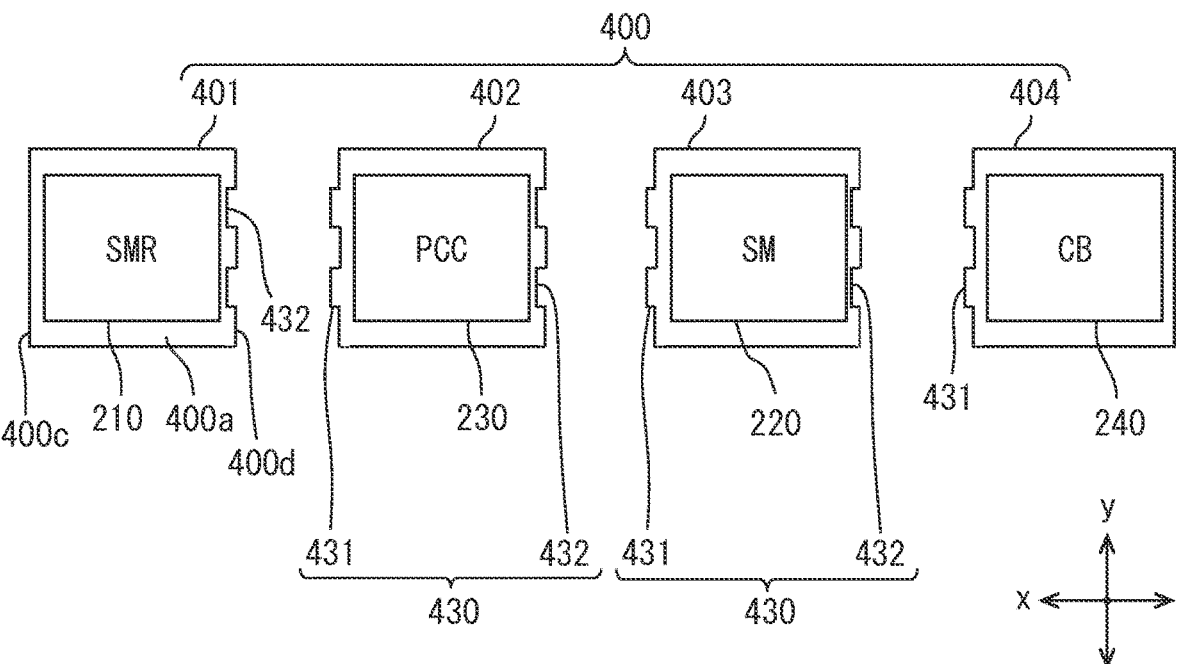
FIG. 6 is an exploded top view of the power distribution device.
FIG. 7 is a top view showing a modification of the power distribution device.

In this case, for example, as shown in FIG. 6, each support portion is decoupled. Then, as shown in FIG. 7, the switch matrix 220 and the third support portion 403 on which it is mounted are removed. The first coupling portion 431 of the fourth support portion 404 is fitted to the second coupling portion 432 of the second support portion 402. The second connection terminal 252 and the third connection terminal 253 shown in FIG. 1 are connected by a suitable conductive member such as a wire.

The second support portion 402 corresponds to the first mounting portion. The third support portion 403 corresponds to the second mounting portion. The fourth support portion 404 corresponds to the third mounting portion. The second coupling portion 432 of the second support portion 402 and the first coupling portion 431 of the third support portion 403 correspond to the first coupling mechanism. The second coupling portion 432 of the third support portion 403 and the first coupling portion 431 of the fourth support portion 404 correspond to the second coupling mechanism.

<Heat and Electromagnetic Noise>

The SMR 210 located at a left end of the row serves as a part of a current path through which power of about 800V flows between the battery 100 and the power conversion device 300. Therefore, the SMR 210 tends to generate heat and electromagnetic noise.

The pre-charge circuit 230 located in the second one from the left end of the row is used when the smoothing capacitor 330 is charged. The pre-charge circuit 230 is not used when the power conversion device 300 is in use. Therefore, the pre-charge circuit 230 is less likely to generate heat and electromagnetic noise.

The switch matrix 220 positioned in the third one from the left end of the row is responsible for part of the current path through which power of about 400V flows between the battery 100 and the electrical devices. If this current path is not carried, the switch matrix 220 bears a part of the current path through which power of about 800V flows between the battery 100 and the power conversion device 300. In this manner, the power of about 400V and the power of about 800V selectively flow through the switch matrix 220. Therefore, the switch matrix 220 tends to generate heat and electromagnetic noise next to the SMR 210.

The control board 240 located at the right end outputs the control signals. An amount of current of this control signal is much lower than an amount of current of power flowing through the SMR 210 and the switch matrix 220, respectively. A voltage level of the control signal is much lower, in different orders of magnitude, than a voltage level of the power flowing through the SMR 210 and the switch matrix 220, respectively. Therefore, it is difficult for the control board 240 to generate heat. A current that does not change with time in the control board 240 merely generate a weak electromagnetic noise.

As described above, the SMR 210 and the switch matrix 220 are more likely to generate heat and electromagnetic noise than the pre-charge circuit 230 and the control board 240. The pre-charge circuit 230 is located between the SMR 210 and the switch matrix 220 where heat and electromagnetic noise are likely to occur. Then, the switch matrix 220 and the control substrate 240 are arranged in the x-direction in which heat and electromagnetic noise are less likely to occur than the SMR 210.

<Heat Transfer Sheet>

The heat transfer sheet 410 has a first heat transfer sheet 411, a second heat transfer sheet 412 and a third heat transfer sheet 413 each having an insulating property. The first heat transfer sheet 411 to the third heat transfer sheet 413 are in a shape of a thin sheet in the z-direction, or in a form of a semi-solid.

The first heat transfer sheet 411 is provided on the mounting surface 400a of the first support portion 401. The first heat transfer sheet 411 is interposed between the first support portion 401 and the SMR 210. The thermal resistance between the first support portion 401 and the SMR 210 is lowered by the first heat transfer sheet 411.

The second heat transfer sheet 412 is provided on the mounting surface 400a of the second support portion 402. The second heat transfer sheet 412 is interposed between the second support 402 and the pre-charge circuit 230. The thermal resistance between the second support portion 402 and the pre-charge circuit 230 is reduced by the second heat transfer sheet 412.

The third heat transfer sheet 413 is provided on the mounting surface 400a of the third support portion 403. The third heat transfer sheet 413 is interposed between the third support portion 403 and the switch matrix 220. The thermal resistance between the third support portion 403 and the switch matrix 220 is reduced by the third heat transfer sheet 413.

The fourth support portion 404 is not provided with a heat transfer material for positively transferring heat generated in the control board 240 to the fourth support portion 404. Therefore, the thermal resistance between the fourth support portion 404 and the control board 240 is not positively lowered. The thermal resistance between the fourth support portion 404 and the control board 240 is higher than the thermal resistance between the third support portion 403 and the switch matrix 220.

As described above, the SMR 210 and the switch matrix 220 each generates more heat than the pre-charge circuit 230. In order to positively transfer heat generated in the SMR 210 to the support portion 400, the thermal resistance between the SMR 210 and the first support portion 401 is lower than the heat resistance between the pre-charge circuit 230 and the second support portion 402. Similarly, the thermal resistance between the switch matrix 220 and the third support portion 403 is lower than the thermal resistance between the pre-charge circuit 230 and the second support portion 402 in order to positively transfer heat generated in the switch matrix 220 to the support portion 400. Such a difference in thermal resistance may be achieved by, for example, adjusting a contact area between the heat transfer sheet and each member, adjusting the thickness of the heat transfer sheet in the z-direction, or adjusting the material of the heat transfer sheet.

<Conductive Busbar>

Various kinds of switches described so far are coupled with conductive busbars for connection to various power lines. Conductive busbars are shown thicker than the power lines in FIG. 1.

The first SMR 211 is coupled with a first conductive busbar 281 for connecting to the first power line 271. The second SMR 212 is coupled with a second conductive busbar 282 for connecting to the fourth power line 274. The first conductive busbar 281 and the second conductive busbar 282 correspond to switch conductive members.

The charge switch 231 and the charge resistor 232 are coupled with a third conductive busbar 283 for connecting to the fourth power line 274. The charge switch 231 and the charge resistor 232 are electrically connected in series via the third conductive busbar 283. The third conductive busbar 283 corresponds to a charge conductive member.

The first selector switch 221 is coupled with a fourth conductive busbar 284 for electrically connecting each of the second power line 272 and the third power line 273. The second selector switch 222 is coupled with a fifth conductive busbar 285 for connecting the second power line 272. The third selector switch 223 is coupled with a sixth conductive busbar 286 for connecting the third power line 273.

The fourth conductive busbar 284 bridges the fifth conductive busbar 285 and the sixth conductive busbar 286. The fourth conductive busbar 284 is electrically connected to the second power line 272 via the fifth conductive busbar 285. The fourth conductive busbar 284 is electrically connected to the third power line 273 via the sixth conductive busbar 286. The fourth conductive busbar 284, the fifth conductive busbar 285 and the sixth conductive busbar 286 correspond to selector conductive members.

<Positional Relationship>

Locations of the first, second, third, fourth, fifth and sixth conductive busbars 281, 282, 283, 284, 285 and 286 in the z-direction are described below with reference to FIG. 5. However, in order to avoid complicating notations in FIG. 5, each of the second conductive busbar 282, the fifth conductive busbar 285, and the sixth conductive busbar 286 are omitted in the illustration.

In this embodiment, a location of the second conductive busbar 282 in the z-direction is equivalent to a location of the first conductive busbar 281 in the z-direction. Locations of the fifth conductive busbar 285 and the sixth conductive busbar 286 in the z-direction are equivalent to a location of the fourth conductive busbar 284 in the z-direction. However, the locations of the various conductive busbars in the z-direction may not be equivalent to shown in this embodiment, but may be different.

A part of each of the first conductive busbar 281 and the second conductive busbar 282 is located closer to the first heat transfer sheet 411 than each of the first SMR 211 and the second SMR 212. Along with this, a part of each of the first conductive busbar 281 and the second conductive busbar 282 is provided on the first heat transfer sheet 411. Thereby, heat of the first conductive busbar 281 and the second conductive busbar 282 is conducted to the first heat transfer sheet 411.

A part of the third conductive busbar 283 is located closer to the second heat transfer sheet 412 than the charge switch 231 and the charge resistor 232 are. Along with this, a part of the third conductive busbar 283 is provided on the second heat transfer sheet 412. Thereby, heat of the third conductive busbar 283 is conducted to the second heat transfer sheet 412.

Part of each of the fourth conductive busbar 284, the fifth conductive busbar 285 and the sixth conductive busbar 286 is located closer to the third heat transfer sheet 413 than each of the first selector switch 221, the second selector switch 222 and the third selector switch 223. Along with this, a part of each of the fourth conductive busbar 284 to the sixth conductive busbar 286 is provided on the third heat transfer sheet 413. Thereby, heat of the fourth conductive busbar 284 to the sixth conductive busbar 286 is conducted to the third heat transfer sheet 413.

A part of the first power line 271 to the eighth power line 278 may be located closer to the first heat transfer sheet 411 than the first SMR 211 and the second SMR 212 in the first support portion 401, respectively. Some of these various kinds of power lines may be located closer to the second heat transfer sheet 412 than each of the charge switch 231 and the charge resistor 232 in the second support portion 402. Part of each kinds of these various power lines may be located closer to the third heat transfer sheet 413 than each of the first selector switch 221, the second selector switch 222 and the third selector switch 223 in the third support portion 403. Part of each kinds of these various power lines may be provided on the heat transfer sheet 410.

However, on the contrary, all of the first power line 271 to the eighth power line 278 may be separated from the first heat transfer sheet 411 in the z-direction in the first support portion 401 more than the first SMR 211 and the second SMR 212 respectively. All of these various kinds of power lines may be spaced apart from the second heat transfer sheet 412 in the z-direction at the second support portion 402 more than the charge switch 231 and the charge resistor 232, respectively. All of various kinds of these various power lines may be spaced apart from the third heat transfer sheet 413 in the z-direction at the third support portion 403 more than each of the first selector switch 221, the second selector switch 222 and the third selector switch 223. Not all of these various kinds of power lines need to be provided on the heat transfer sheet 410.

<Housing>

The housing 420 has a base member 421 and a floor member 422. The base member 421 is formed by, for example, die casting aluminum. The floor member 422 is manufactured by pressing an aluminum plate, for example.

The base member 421 has an inner wall surface 421a and an outer wall surface 421b arranged in a spaced apart manner in the z-direction, and a side wall surface 421c coupling those two wall surfaces. The base member 421 is formed with a groove portion 421d that is selectively recessed from the inner wall surface 421a toward the outer wall surface 421b. A thickness of the base member 421 in the z-direction is uneven due to the groove portion 421d.

The floor member 422 has a flat shape with a small thickness in the z-direction. The floor member 422 has an upper surface 422a and a lower surface 422b arranged in a spaced apart manner in the z-direction. The floor member 422 is provided on a side to the inner wall surface 421a of the base member 421 so as to cover a space defined by the groove portion 421d. The floor member 422 is arranged to oppose the base member 421 in such a manner that the lower surface 422b and the inner wall surface 421a are in contact with each other in the z-direction. As a result, a part of the lower surface 422b and the wall surface defining the groove portion 421d are arranged to oppose each other while being separated from each other in the z-direction. In this opposing arrangement state, the floor member 422 is mechanically connected to the base member 421 by welding or the like.

<Channel>

A channel 423 is formed by a lower surface 422b and a wall surface defining the groove portion 421d, which are separated from each other in the z-direction, by welding the floor member 422 and the base member 421 together. A portion of the lower surface 422b that forms the channel 423 may adopt a flat shape as shown in FIG. 5, alternatively a configuration in which a plurality of protrusions for increasing contact surface area with the cooling fluid flowing in the channel 423 may be adopted. The base member 421 and the floor member 422 correspond to a cooler device.

A supply port 423a through which the cooling fluid is supplied to the channel 423 and a discharge port 423b through which the cooling fluid is discharged from the channel 423 are each opened in the side wall surface 421c. The sidewall surface 421c has two lateral side surfaces arranged in the x-direction and two longitudinal side surfaces arranged in the y-direction. Each of the supply port 423a and the discharge port 423b opens on one of the two lateral sides. The supply port 423a and the discharge port 423b are spaced apart in the y-direction.

As indicated by a dashed arrows in FIG. 4, the channel 423 extends in the x-direction from one of the two lateral sides to the other, then extends in the y-direction from one of the longitudinal sides to the other, and then extends in the x-direction from the other of the lateral sides to one of them. Thus, the channel 423 has a U shape on a plane perpendicular to the z-direction.

<Heat Conduction>

Mounting surfaces 400b of the first support portion 401 to the fourth support portion 404 are provided on the upper surface 422a, which is a back side of the lower surface 422b of the floor member 422 defining a part of the channel 423. A configuration in which a heat transfer sheet different from the heat transfer sheet 410 is provided between the upper surface 422a and the mounting surface 400b may also be adopted.

As mentioned above, the thermal resistance between the SMR 210 and the first support portion 401 is lower than the thermal resistance between the pre-charge circuit 230 and the second support portion 402. The thermal resistance between the switch matrix 220 and the third support portion 403 is lower than the thermal resistance between the pre-charge circuit 230 and the second support portion 402.

Due to this difference in thermal resistance, the thermal resistance between the SMR 210 and the floor member 422 and the thermal resistance between the switch matrix 220 and the floor member 422 are lower than the thermal resistance between the pre-charge circuit 230 and the floor member 422. Note that the thermal resistance between the pre-charge circuit 230 and the floor member 422 is lower than the thermal resistance between the control board 240 and the floor member 422.

As shown in FIGS. 4 and 5, the first support portion 401 to the fourth support portion 404 are arranged in the x-direction from one side to the other of two lateral side surfaces. The first support portion 401 is located on a one side of the two lateral side surfaces, on which the supply port 423a and the discharge port 423b are formed, in the x-direction relative to the other support portions. The first support portion 401 is located on a position closer to the supply port 423a of a part of the channel 423 extending in the x-direction from the supply port 423a than the other support portions.

As shown in FIGS. 4 and 5, the first to third support portions 401 to 403 are arranged with the channel 423 in the z-direction. However, the fourth support portion 404 is not arranged with the channel 423 in the z-direction. Therefore, the first support portion 401 to the third support portion 403 are more likely than the fourth support portion 404 to exchange heat with the cooling fluid flowing through the channel 423. The SMR 210, the pre-charge circuit 230 and the switch matrix 220 are more likely to exchange heat with the cooling fluid than the control board 240.

Figure 8:
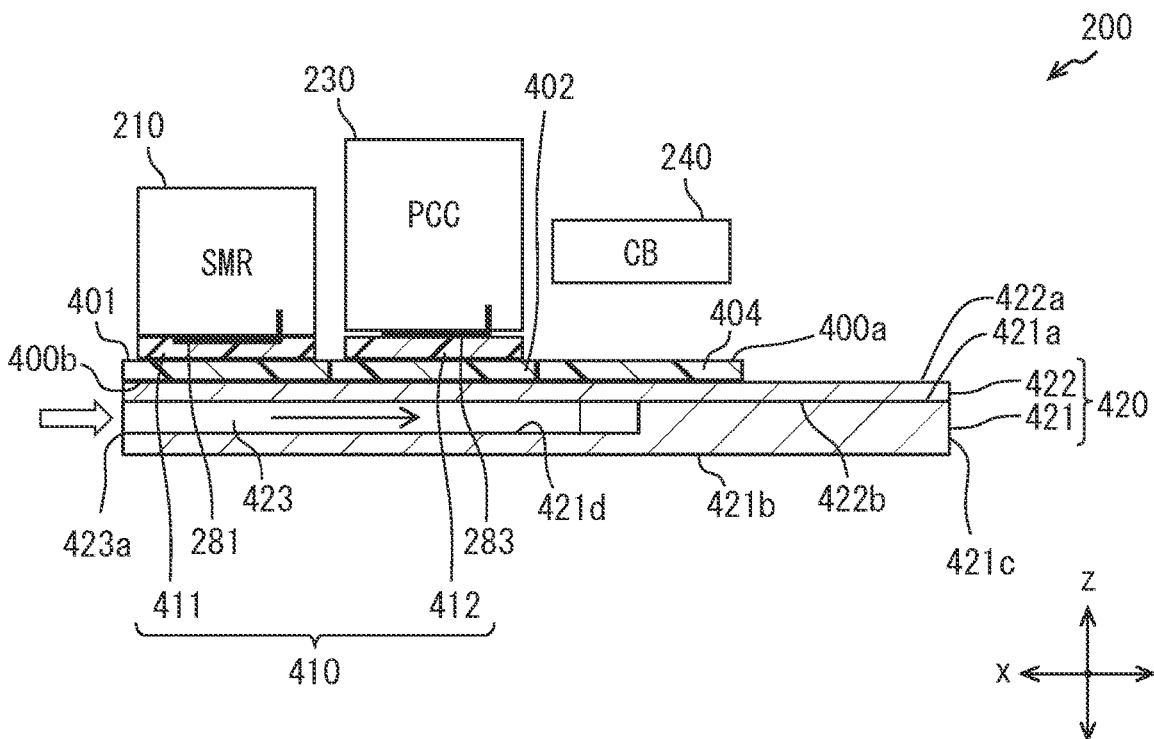
FIG. 8 is a partial cross-sectional view showing a modification of the power distribution device.

As described in FIGS. 6 and 7, if the second support portion 402 and the fourth support portion 404 are coupled by removing the switch matrix 220 and the third support portion 403, as shown in FIG. 8, the fourth support portion 404 is arranged side by side with the channel 423 in the z-direction. The other side of the two lateral sides in the channel 423 is located closer to a one side of the two lateral sides than the other side of the two lateral sides of the fourth support portion 404.

Operations and Advantages

The SMR 210 and the control board 240 are arranged in the x-direction via the pre-charge circuit 230. According to this configuration, the control board 240 is protected by suppressing an influence of heat and electromagnetic noise generated in the SMR 210 by a current.

Particularly in this embodiment, the SMR 210 and the control board 240 are not opposed in the x-direction due to the pre-charge circuit 230. According to this configuration, the control board 240 is protected by effectively suppressing the influence of heat and electromagnetic noise generated in the SMR 210.

The pre-charge circuit 230, which hardly generates heat, is located between the SMR 210 and the switch matrix 220, which tend to generate heat. This prevents the SMR 210 and the switch matrix 220 from reaching a high temperature state.

Particularly in this embodiment, the SMR 210 and the switch matrix 220 are not opposed in the x-direction due to the pre-charge circuit 230. This effectively prevents the SMR 210 and the switch matrix 220 from reaching a high temperature state.

The shapes of the first coupling portions 431 provided on the plurality of support portions are the same. At the same time, the shapes of the second coupling portions 432 provided on the plurality of support portions are the same. Therefore, as described above, even if the switch matrix 220 and the third support portion 403 on which it is mounted are removed, the second coupling portion 432 of the second support portion 402 and the first coupling portion 431 of the fourth support portion 404 are coupled to each other.

A housing 420 is provided with the support portion 400 on which the SMR 210, the pre-charge circuit 230, the switch matrix 220 and the control board 240 are mounted. A channel 423 through which a cooling fluid flows is formed in the housing 420. According to this, temperature rise of each of the SMR 210, the pre-charge circuit 230, the switch matrix 220, and the control board 240 is suppressed.

A thermal resistance between the SMR 210 and the first support portion 401 is lower than a thermal resistance between the pre-charge circuit 230 and the second support portion 402. The thermal resistance between the switch matrix 220 and the third support portion 403 is lower than the thermal resistance between the pre-charge circuit 230 and the second support portion 402. In other words, the thermal resistance between the pre-charge circuit 230 and the second support portion 402 is higher than the thermal resistance between the SMR 210 and the first support portion 401 and the thermal resistance between the switch matrix 220 and the third support portion 403, respectively.

According to this, a temperature rise of each of the first support portion 401 and the third support portion 403 connected to the second support portion 402 may be suppressed due to heat exchange with the second support portion 402 of the pre-charge circuit 230. As a result, heat exchange between the SMR 210 and the first support portion 401 is less likely to be hindered. Heat exchange between the switch matrix 220 and the third support portion 403 is less likely to be hindered.

Also, heat exchange of the SMR 210 with the cooling fluid via the first support portion 401 is less likely to be hindered by heat exchange of the pre-charge circuit 230 with the cooling fluid via the second support portion 402. A heat exchange with the cooling fluid through the third support portion 403 of the switch matrix 220 is less likely to be hindered. This prevents the SMR 210 and the switch matrix 220 from reaching a high temperature state.

A part of each of the first conductive busbar 281 and the second conductive busbar 282 is located closer to the first heat transfer sheet 411 than each of the first SMR 211 and the second SMR 212. A part of each of the first conductive busbar 281 and the second conductive busbar 282 is located closer to the channel 423 in the z-direction than each of the first SMR 211 and the second SMR 212. According to this, temperature rise of the first conductive busbar 281 and the second conductive busbar 282 is suppressed.

A part of the third conductive busbar 283 is located closer to the second heat transfer sheet 412 than the charge switch 231 and the charge resistor 232. A portion of the third conductive busbar 283 is located closer to the flow path 423 in the −z direction than the charge switch 231 and the charge resistor 232. According to this, a temperature rise of the third conductive busbar 283 is suppressed.

Part of each of the fourth conductive busbar 284, the fifth conductive busbar 285 and the sixth conductive busbar 286 is located closer to the third heat transfer sheet 413 than each of the first selector switch 221, the second selector switch 222 and the third selector switch 223. Part of each of the fourth conductive busbar 284, the fifth conductive busbar 285 and the sixth conductive busbar 286 is located closer to the channel 423 in the z-direction than each of the first selector switch 221, the second selector switch 222 and the third selector switch 223. Accordingly, temperature rise of each of the fourth conductive busbar 284 to the sixth conductive busbar 286 is suppressed.

A part of each of the first conductive busbar 281 to the sixth conductive busbar 286 is provided on the heat transfer sheet 410. According to this, the first to sixth conductive busbars 281 to 286 are suppressed from being in high temperature state.

Also, as described above, a part of the first power line 271 to the eighth power line 278 may be positioned on a side of the heat transfer sheet 410. Part of various kinds of power lines may be provided on the heat transfer sheet 410. This prevents the first power line 271 to the eighth power line 278 from reaching a high temperature state.

The first support portion 401 on which the SMR 210 is mounted is located on a position closer to the supply port 423a in the x-direction than others of the second support portion 402 to the fourth support portion 404. The first support portion 401 is located on a position closer to the supply port 423a of a part of the channel 423 extending in the x-direction from the supply port 423a than the other support portions. This facilitates cooling of the SMR 210 mounted on the first support portion 401 by the cooling fluid.

First Modification

Figure 9:
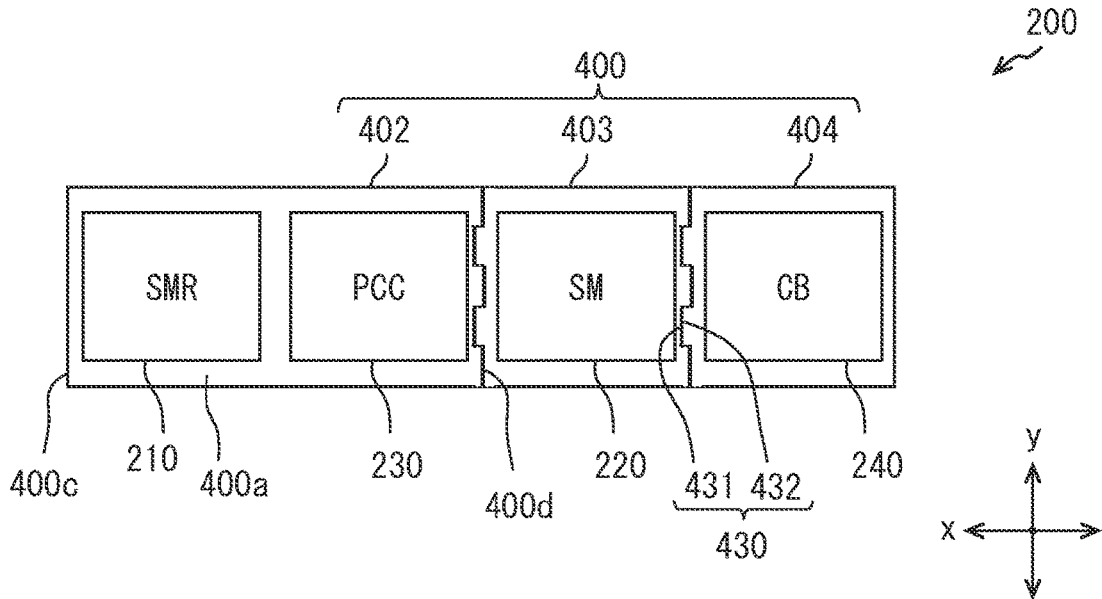
FIG. 9 is a top view showing a modification of the power distribution device.

This embodiment shows an example in which the SMR 210 is mounted on the first support portion 401 and the pre-charge circuit 230 is mounted on the second support portion 402. However, for example, as shown in FIG. 9, a configuration in which the SMR 210 and the pre-charge circuit 230 are mounted on the second support portion 402 may also be adopted. In the modified example shown in FIG. 9, the first coupling portion 431 is not provided on the left surface 400c of the second support portion 402. A configuration in which the SMR 210 and the pre-charge circuit 230 are mounted on the first support portion 401 may also be adopted.

Second Modification

Figure 10:
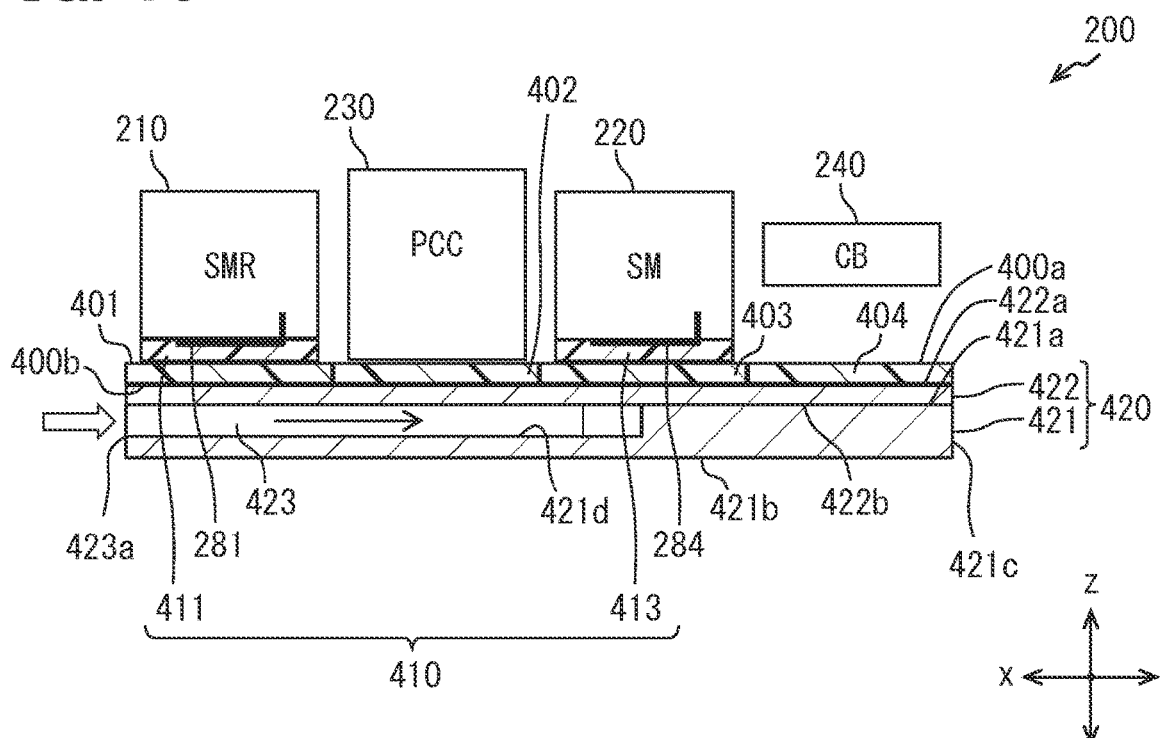
FIG. 10 is a partial cross-sectional view showing a modification of the power distribution device.

This embodiment shows an example in which the second heat transfer sheet 412 is provided on the second support portion 402. However, for example, as shown in FIG. 10, a configuration in which the second heat transfer sheet 412 is not provided on the second support portion 402 may be adopted. In this modification, the pre-charge circuit 230 is provided directly on the mounting surface 400a of the second support portion 402.

In this embodiment, lengths of the SMR 210, the pre-charge circuit 230, and the switch matrix 220 in the z-direction are not particularly mentioned. Depending on the product and configuration employed, the pre-charge circuit 230 may be longer in the z-direction than each of the SMR 210 and the switch matrix 220, as shown in FIGS. 5 and 10, for example.

In such a configuration, the pre-charge circuit 230 is provided on the mounting surface 400a of the second support portion 402 without providing the second heat transfer sheet 412 on the second support portion 402 as described above. By doing so, an increase in the size of the power distribution device 200 in the z-direction is suppressed. This makes it easy to install the power distribution device 200 in a small gap in the z-direction between the body and the floor of the passenger compartment of the electric vehicle.

Third Modification

This embodiment shows an example in which the power distribution device 200 has the support portion 400. However, the power distribution device 200 may not have the support portion 400 as shown in FIGS. 11 and 12, for example.

Figure 11:
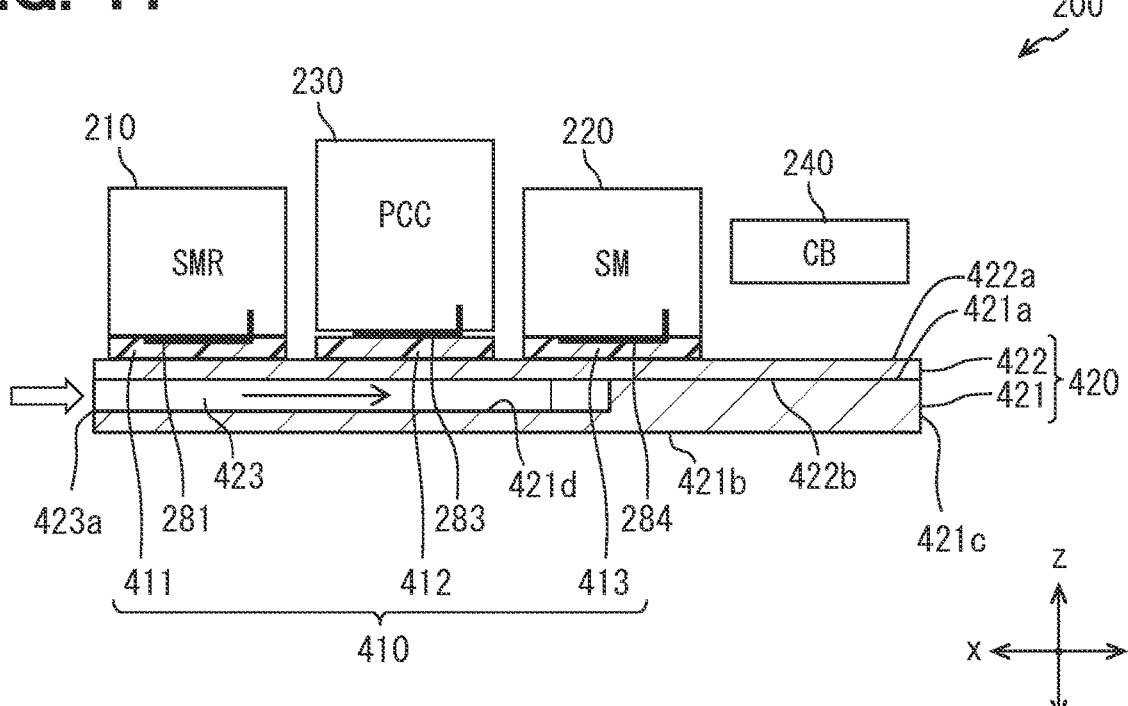
FIG. 11 is a partial cross-sectional view showing a modification of the power distribution device.

In the modification shown in FIG. 11, the SMR 210 is provided on the floor member 422 with the first heat transfer sheet 411 interposed therebetween. A pre-charge circuit 230 is provided on the floor member 422 via the second heat transfer sheet 412. The switch matrix 220 is provided on the floor member 422 via the third heat transfer sheet 413.

Figure 12:
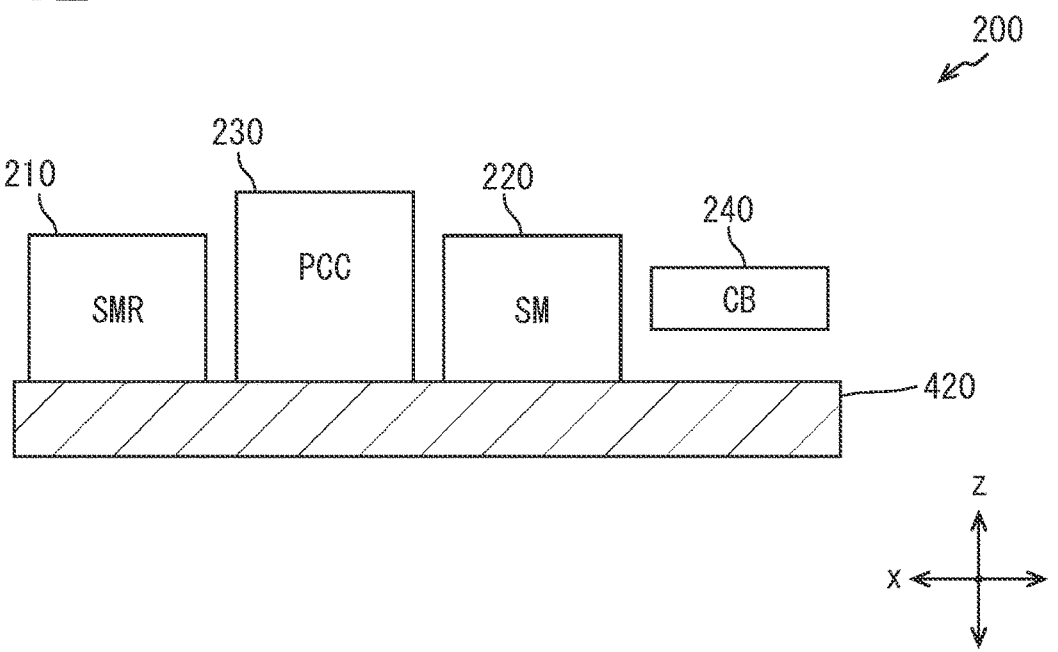
FIG. 12 is a partial cross-sectional view showing a modification of the power distribution device.

In the modification shown in FIG. 12, the SMR 210 is mounted directly on the floor member 422. The pre-charge circuit 230 is provided directly on the floor member 422. The switch matrix 220 is provided directly on the floor member 422.

In such a modified example, it is possible to adopt a configuration in which the first coupling portion 431 and the second coupling portion 432 are provided in the SMR 210, the pre-charge circuit 230, the switch matrix 220, the control board 240, and the floor member 422.

Fourth Modification

In the present embodiment, a snap fit is exemplified as a specific form of the first coupling portion 431 and the second coupling portion 432. However, the forms of the first coupling portion 431 and the second coupling portion 432 are not particularly limited. As another specific form of the first coupling portion 431 and the second coupling portion 432, for example, bolt holes and bolts can be adopted.

Fifth Modification

This embodiment shows an example in which the channel 423 is formed in the housing 420. However, the channel 423 may not be formed in the housing 420 as shown in FIG. 12, for example. The housing 420 does not have to function as the cooler device.

Sixth Modification

Figure 13:
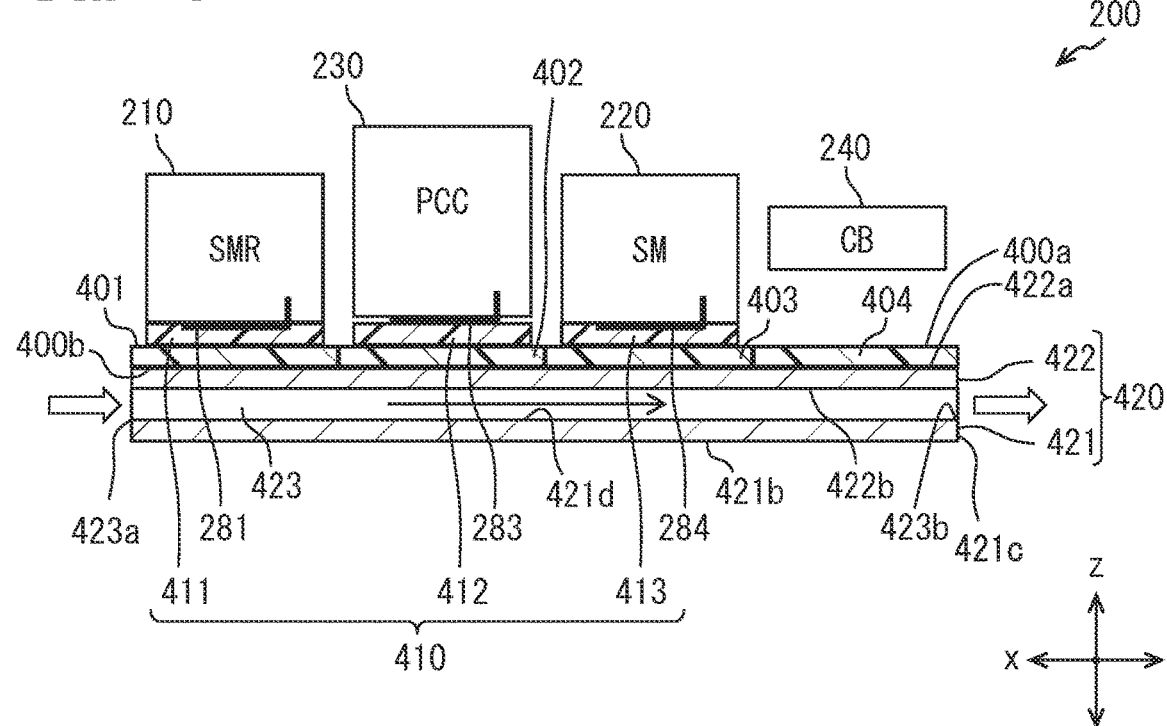
FIG. 13 is a partial cross-sectional view showing a modification of the power distribution device.

This embodiment shows an example in which the supply port 423*a* and the discharge port 423*b* are formed on one of the two lateral sides of the base member 421. However, for example, as shown in FIG. 13, it is also possible to employ a configuration in which the supply port 423*a* is formed on one of the two lateral sides and the discharge port 423*b* is formed on the other one of the two lateral sides.

Seventh Modification

Although not specifically mentioned in this embodiment, the power distribution device 200 may include a shunt resistor, a fuse, and a discharge circuit.

The shunt resistor is a passive element for detecting current on a side of the SMR 210 in the power distribution device 200. The shunt resistor is electrically connected to the SMR 210. Therefore, a temperature of the shunt resistor tends to rise. An electrical resistance of the shunt resistor varies with temperature. Due to this variation in an electrical resistance, the accuracy of current detection using the shunt resistor may be lowered.

In order to avoid this, a configuration in which a shunt resistor is provided on the floor device 422 of the housing 420 having the channel 423 via an electrical insulator may be adopted. This facilitates keeping a temperature of the shunt resistor at a temperature of the cooling fluid flowing through the channel 423. An electrical resistance of the shunt resistor is less likely to fluctuate. As a result, deterioration in current detection accuracy using the shunt resistor is suppressed.

The fuse is a passive element for suppressing overcurrent from flowing through the power distribution device 200. The fuse has a function of melting by Joule heat generated when overcurrent flows. For this reason, for example, if the fuse is in a state of being able to conduct heat with the housing 420 having the channel 423, the fuse may be difficult to melt even though overcurrent is flowing. As a result, overcurrent may flow through the power distribution device 200 for a long period of time.

In order to avoid this, a configuration can be adopted in which the thermal resistance between the fuse and the housing 420 is higher than the thermal resistance between other member and the housing 420. For example, a configuration in which the fuse is separated from the housing 420 may be adopted.

The discharge circuit has a discharge switch and a discharge resistor connected in series. The discharge switch and the discharge resistor are connected in series between the first power line 271 and the fourth power line 274.

When discharging the charge accumulated in the smoothing capacitor 330, the control board 240 outputs control signals to the first SMR 211, the second SMR 212, and the discharge switch. As a result, only the discharge switch among the various kinds of switches is turned on.

Such switch control forms a closed loop including the discharge resistor and the smoothing capacitor 330. The discharge resistor and the smoothing capacitor 330 are connected in series. As a result, charge accumulated in the smoothing capacitor 330 flows through the discharge resistor. The charge accumulated in the smoothing capacitor 330 is gradually discharged by causing the charge to flow through the discharge resistor as described above.

A configuration in which the discharge circuit can conduct heat with the floor 422 can be adopted. Conversely, a configuration in which the discharge circuit is separated from the floor 422 can also be adopted.

Other Modifications

This embodiment shows an example in which the control board 240 outputs and does not output control signals to various switches. However, the control board 240 may acquire outputs of various sensors that detect states of the SMR 210, the switch matrix 220, and the pre-charge circuit 230, and output them to the in-vehicle ECU. The control board 240 may have function of processing at least one of electrical signals for the SMR 210, the switch matrix 220, and the pre-charge circuit 230.

This embodiment shows an example in which the thermal resistance between the pre-charge circuit 230 and the second support portion 402 is higher than the thermal resistance between the SMR 210 and the first support portion 401 and the thermal resistance between the switch matrix 220 and the third support portion 403, respectively. However, the thermal resistance between the pre-charge circuit 230 and the second support portion 402 may be lower than at least one of the thermal resistance between the SMR 210 and the first support portion 401 and the thermal resistance between the switch matrix 220 and the third support portion 403.

This embodiment shows an example in which the thermal resistance between the fourth support 404 and the control board 240 is higher than the thermal resistance between the third support 403 and the switch matrix 220. However, a configuration in which the thermal resistance between the fourth support portion 404 and the control substrate 240 is lower than the thermal resistance between the third support portion 403 and the switch matrix 220 may also be adopted.

This embodiment shows an example in which a part of the first to sixth conductive busbars 281 to 286 is provided on the heat transfer sheet 410. However, these various kinds of conductive busbars do not have to be provided on the heat transfer sheet 410.

This shows an example in which a part of each of the first conductive busbar 281 and the second conductive busbar 282 is located closer to the first heat transfer sheet 411 than each of the first SMR 211 and the second SMR 212. However, all of the first conductive busbar 281 and the second conductive busbar 282 may be located further away from the first heat transfer sheet 411 in the z-direction than each of the first SMR 211 and the second SMR 212.

This shows an example in which a part of the third conductive busbar 283 is located closer to the second heat transfer sheet 412 than the charge switch 231 and the charge resistor 232. However, all of the third conductive busbar 283 may be further away from the second heat transfer sheet 412 in the z-direction than the charge switch 231 and the charge resistor 232, respectively.

This shows an example in which in which a part of each of the fourth conductive busbar 284, the fifth conductive busbar 285 and the sixth conductive busbar 286 is located closer to the third heat transfer sheet 413 than each of the first selector switch 221, the second selector switch 222 and the third selector switch 223. However, all of the fourth conductive busbar 284, the fifth conductive busbar 285 and the sixth conductive busbar 286 may be further away from the third heat transfer sheet 413 in the z-direction than each of the first selector switch 221, the second selector switch 222 and the third selector switch 223.

Although the present disclosure has been described in accordance with embodiments, it is understood that the present disclosure is not limited to such embodiments or structures. To the contrary, the present disclosure is intended to cover various modification and equivalent arrangements. In addition, while various combinations and modes are described in the present disclosure, other combinations and modes including only one element, more elements, or less elements therein are also within the scope and spirit of the present disclosure.

What is claimed is:

1. A power distribution device comprising:
a switch unit including a switch which switches between on and off of current between a power receiving object having a smoothing capacitor and a battery;
a charge unit including a charge switch and a charge resistor which are provided to charge the smoothing capacitor with power supplied from the battery;
a processing unit through which a current having a smaller amount of current than a current flowing through the switch unit;
a selector unit including a selector switch which switches between individual outputs and consolidated output of output powers from a plurality of individual batteries included in the battery;
a first mounting portion on which the charge unit is mounted;
a second mounting portion on which the selector unit is mounted; and
a third mounting portion on which the processing unit is mounted, wherein
the switch unit and the processing unit are arranged in an arrangement direction while arranging the charge unit therebetween,
the switch unit and the selector unit are arranged in the arrangement direction while arranging the charge unit therebetween, and
a first coupling mechanism between the first mounting portion and the second mounting portion and a second coupling mechanism between the second mounting portion and the third mounting portion are the same.

2. The power distribution device according to claim 1, further comprising:
a cooler device which cools the switch unit, the charge unit, the selector unit, and the processing unit, respectively.

3. The power distribution device according to claim 2, wherein
a thermal resistance between at least one of the switch unit and the selector unit and the cooler device is lower than a thermal resistance between at least one of the charge unit and the processing unit and the cooler device.

4. The power distribution device according to claim 2, wherein
the switch unit has a switch conductive member electrically connected to the switch, and
a part of the switch conductive member is located closer to the cooler device than the switch.

5. The power distribution device according to claim 2, wherein the charge unit has a charge conductive member electrically connected to the charge resistor and the charge switch respectively, and
a part of the charge conductive member is located closer to the cooler device than the charge resistor and the charge switch.

6. The power distribution device according to claim 2, wherein
the selector unit has a selector conductive member electrically connected to the selector switch; and
the selector conductive member has a portion which is located closer to the cooler device than the selector switch.

7. The power distribution device according to claim 2, wherein
the cooler device has a supply port to which a cooling fluid is supplied, and a channel at least partially extending from the supply port in the arrangement direction, and
the switch unit is located closer to the supply port than the charge unit in the arrangement direction.

8. A power distribution device comprising:
a switch unit including a switch which switches between on and off of current between a power receiving object having a smoothing capacitor and a battery;
a charge unit including a charge switch and a charge resistor which are provided to charge the smoothing capacitor with power supplied from the battery;
a processing unit through which a current having a smaller amount of current than a current flowing through the switch unit;
a selector unit including a selector switch which switches between individual outputs and consolidated output of output powers from a plurality of individual batteries included in the battery; and
a cooler device which cools the switch unit, the charge unit, the selector unit, and the processing unit, respectively, wherein
the switch unit and the processing unit are arranged in an arrangement direction while arranging the charge unit therebetween,
the switch unit and the selector unit are arranged in the arrangement direction while arranging the charge unit therebetween, and
a thermal resistance between at least one of the switch unit and the selector unit and the cooler device is lower than a thermal resistance between at least one of the charge unit and the processing unit and the cooler device.

9. A power distribution device comprising:
a switch unit including a switch which switches between on and off of current between a power receiving object having a smoothing capacitor and a battery;
a charge unit including a charge switch and a charge resistor which are provided to charge the smoothing capacitor with power supplied from the battery;
a processing unit through which a current having a smaller amount of current than a current flowing through the switch unit;
a selector unit including a selector switch which switches between individual outputs and consolidated output of output powers from a plurality of individual batteries included in the battery; and
a cooler device which cools the switch unit, the charge unit, the selector unit, and the processing unit, respectively, wherein the switch unit and the processing unit are arranged in an arrangement direction while arranging the charge unit therebetween, the switch unit and the selector unit are arranged in the arrangement direction while arranging the charge unit therebetween, the switch unit has a switch conductive member electrically connected to the switch, and a part of the switch conductive member is located closer to the cooler device than the switch.

10. A power distribution device comprising:

a switch unit including a switch which switches between on and off of current between a power receiving object having a smoothing capacitor and a battery;

a charge unit including a charge switch and a charge resistor which are provided to charge the smoothing capacitor with power supplied from the battery;

a processing unit through which a current having a smaller amount of current than a current flowing through the switch unit;

a selector unit including a selector switch which switches between individual outputs and consolidated output of output powers from a plurality of individual batteries included in the battery; and a cooler device which cools the switch unit, the charge unit, the selector unit, and the processing unit, respectively, wherein the switch unit and the processing unit are arranged in an arrangement direction while arranging the charge unit therebetween, the switch unit and the selector unit are arranged in the arrangement direction while arranging the charge unit therebetween, the charge unit has a charge conductive member electrically connected to the charge resistor and the charge switch respectively, and a part of the charge conductive member is located closer to the cooler device than the charge resistor and the charge switch.

11. A power distribution device comprising:

a switch unit including a switch which switches between on and off of current between a power receiving object having a smoothing capacitor and a battery;

a charge unit including a charge switch and a charge resistor which are provided to charge the smoothing capacitor with power supplied from the battery;

a processing unit through which a current having a smaller amount of current than a current flowing through the switch unit;

a selector unit including a selector switch which switches between individual outputs and consolidated output of output powers from a plurality of individual batteries included in the battery; and a cooler device which cools the switch unit, the charge unit, the selector unit, and the processing unit, respectively, wherein the switch unit and the processing unit are arranged in an arrangement direction while arranging the charge unit therebetween, the switch unit and the selector unit are arranged in the arrangement direction while arranging the charge unit therebetween, the selector unit has a selector conductive member electrically connected to the selector switch; and the selector conductive member has a portion which is located closer to the cooler device than the selector switch.

12. A power distribution device comprising:

a switch unit including a switch which switches between on and off of current between a power receiving object having a smoothing capacitor and a battery;

a charge unit including a charge switch and a charge resistor which are provided to charge the smoothing capacitor with power supplied from the battery;

a processing unit through which a current having a smaller amount of current than a current flowing through the switch unit;

a selector unit including a selector switch which switches between individual outputs and consolidated output of output powers from a plurality of individual batteries included in the battery; and a cooler device which cools the switch unit, the charge unit, the selector unit, and the processing unit, respectively, wherein the switch unit and the processing unit are arranged in an arrangement direction while arranging the charge unit therebetween, the switch unit and the selector unit are arranged in the arrangement direction while arranging the charge unit therebetween, the cooler device has a supply port to which a cooling fluid is supplied, and a channel at least partially extending from the supply port in the arrangement direction, and the switch unit is located closer to the supply port than the charge unit in the arrangement direction.

* * * * *